United States Patent [19]

McMillan et al.

[11] Patent Number: 5,316,579
[45] Date of Patent: May 31, 1994

[54] APPARATUS FOR FORMING A THIN FILM WITH A MIST FORMING MEANS

[75] Inventors: Larry D. McMillan; Carlos A. Paz de Araujo; Tom L. Roberts, all of Colorado Springs, Colo.

[73] Assignee: Symetrix Corporation, Colorado Springs, Colo.

[21] Appl. No.: 877,749

[22] Filed: May 4, 1992

Related U.S. Application Data

[63] Continuation-in-part of Ser. No. 807,439, filed as Dec. 31, 1991, which is a continuation-in-part of Ser. No. 660,428, which is a continuation-in-part of PCT/US89/05882, Dec. 29, 1988, abandoned, which is a continuation-in-part of Ser. No. 290,468, Dec. 27, 1988, abandoned.

[51] Int. Cl.⁵ ............................................. B05C 11/04
[52] U.S. Cl. ..................................... 118/50; 118/326; 118/612; 239/214.25; 239/311; 239/224; 505/826; 505/741; 505/734; 505/950; 427/226
[58] Field of Search ................. 118/612, 300, 50, 326; 239/214.25, 311, 222.11, 224, 214; 505/826, 741, 735, 734, 1; 427/226, 600

[56] References Cited

U.S. PATENT DOCUMENTS

| | | | |
|---|---|---|---|
| 888,444 | 5/1908 | Kestner | 239/214.25 |
| 2,023,061 | 12/1935 | Vicard . | |
| 3,880,112 | 4/1975 | Spitz | 119/8 |
| 4,290,384 | 9/1981 | Ausschnitt | 118/722 |
| 4,521,462 | 6/1985 | Smythe | 118/300 |
| 4,783,006 | 11/1988 | Hayashi | 118/300 |
| 5,034,372 | 7/1991 | Matsuno | 427/600 |
| 5,041,420 | 8/1991 | Nagesh | 427/226 |
| 5,106,828 | 4/1992 | Bhargava | 427/226 |

*Primary Examiner*—W. Gary Jones
*Assistant Examiner*—John Hoffmann
*Attorney, Agent, or Firm*—Duft, Graziano & Forest

[57] ABSTRACT

A method and apparatus are disclosed for generating fine mists of liquids using a rotating turbine blade disposed within an enclosure. A mixture of a liquid and a carrier gas are flowed into the enclosure such that it immediately impacts on the rotating turbine blade disposed near a lower end of the enclosure, and the resulting mist is withdrawn under vacuum near an upper end of the enclosure. A method and apparatus are also disclosed for chemical vapor deposition of thin films of complex chemical compounds using the discussed mists.

8 Claims, 7 Drawing Sheets

APPARATUS FOR FORMING A THIN FILM WITH A MIST FORMING MEANS

This application is a continuation-in-part of U.S. patent application Ser. No. 07/807,439 filed Dec. 13, 1991, which is in turn a continuation-in-part of U.S. patent application Ser. No. 07/660,428 filed Feb. 25, 1991, abandoned, which is in turn a continuation-in-part of PCT application US89/05882 filed Dec. 27, 1989, which is in turn a continuation-in-part of U.S. patent application Ser. No. 07/290,468, abandoned, filed Dec. 27, 1988.

BACKGROUND OF THE INVENTION

1. Field of the Invention

The invention relates to methods and apparatus for flexibly generating fine mists of liquids such as chemical solutions over a wide range of operating parameters, and to methods and apparatus for forming high quality thin films of various complex chemical compounds in a practical and efficient manner using mists of solutions containing the chemical compounds. More particularly, the invention relates to non-reactive, liquid source chemical vapor deposition (LSCVD) methods and apparatus for depositing high quality, stoichiometrically-correct, thin films of a large variety of complex chemical compounds in a practical and efficient manner utilizing mists of stable chemical solutions.

2. Description of Relevant Art

As discussed in the Background section of parent application Ser. No. 660,428, there are known methods and apparatus for depositing thin films of complex chemical compounds such as metal oxides, ferroelectrics, super-conductors, materials with high dielectric constants, gems, etc., although such known methods and apparatus have significant disadvantages associated therewith which prevent them from being adopted for manufacturing thin films of the chemical compounds on a practical, large scale.

In parent application Ser. No. 660,428, applicant has previously proposed novel methods and apparatus involving non-reactive LSCVD techniques which overcome the many problems and disadvantages associated with known deposition techniques for depositing thin films of complex chemical compounds and which can be used for easily and economically producing the thin films.

FIGS. 1-6 of the present application are duplicated from the Ser. No. 660,428 application and are representative of the methods and apparatus disclosed in the parent application.

Although applicant's previously proposed methods and apparatus function very effectively, applicant has found that such methods and apparatus remain to be improved, especially in relation to flexibility in processing parameters for depositing thin films of various chemical compounds.

Particularly, although applicant's previously proposed methods and apparatus can be used to efficiently deposit high quality thin films of many different chemical compounds on a practical, large scale, it is necessary to tune the deposition apparatus (especially the mist generators thereof, such as the one shown in FIG. 4) for each specific chemical which is to be deposited in relation to many processing parameters including temperature, viscosity of the chemical solution, vacuum level, volume of mist to be generated, etc. Once the proper combination of parameters is established for a given chemical compound, the previously proposed methods and apparatus function excellently to deposit high quality thin films of the compound, but the different operating parameters required for depositing different chemical compounds makes if difficult to quickly and efficiently utilize the previous methods/apparatus to deposit thin films of different compounds in succession.

The present invention has been developed to overcome the above disadvantages associated with applicant's previously proposed methods/apparatus, and to generally fulfilled a great need in the art by providing methods and apparatus for quickly, flexibly and efficiently depositing high quality thin film of different complex compounds in succession.

Additionally, according to applicant's previously proposed methods/apparatus different embodiments were disclosed in which thin films of chemical compounds are deposited using mists of solutions containing the compounds either by depositing thin films of the mists at ambient temperatures and subsequently drying same (as disclosed in relation to present FIGS. 1 and 6) or by dissociating the chemical compounds from the mists at elevated temperatures using various heating means in combination (one of which is a UV, spectral heat bath) such that the chemical compound deposits directly on a substrate (as disclosed in relation to present FIG. 5).

Applicant has discovered that a modification or hybrid of such previously disclosed methods works exceptionally well in obtaining high quality thin films of many complex compounds such a ferroelectrics. The modification involves implementation of a UV curing step between the drying step $P_{11}$ and the high temperature annealing step $P_{12}$ used according to the previously disclosed method shown in FIG. 6. More particularly, applicant has found that after a thin film of a solution is deposited from a mist at ambient temperature and subsequently dried according to the previously disclosed method, but before the thin film is high temperature annealed, if the dried film is cured under a UV spectral bath, the desirable dielectric characteristics of the film are tremendously improved.

The UV curing step is preferably carried out at relatively low temperatures of 100°-350° C., which are much less than the temperatures of 600°-850° C. typically required for the high temperature annealing of step $P_{12}$. The UV curing is effectively a "cold annealing" step which functions to create better thin films of chemical compounds by breaking residual solvent bonds remaining in the dried films, thereby inducing additional, desirable crosslinking between molecules of the desired chemical compound in the film. For example, excess hydroxyl groups (OH) typically remain in a dried film according to applicant's previously disclosed methods/apparatus when the solvent of the chemical solution used is an alcohol. When excess hydroxyl groups in the thin film are broken, the resulting oxygen radicals link with other atoms in the film, thus enhancing the oxygen content in the thin film and creating better/stronger linking within the film.

SUMMARY OF THE INVENTION

According to the invention there is provided a method for generating a homogeneous mist of a liquid, comprising the steps of simultaneously flowing a gas and a liquid into an enclosure, highly agitating the gas and liquid within the enclosure using a rotating blade so as to form a mist of fine droplets of the liquid dispersed in the gas, and withdrawing the mist from the enclosure under vacuum. The rotating blade is preferably a turbine blade rotating at a speed of 100-10,000 rpm and disposed near a lower end of the enclosure, the liquid will preferably be flowed into the enclosure such that it immediately impacts on the rotating blade, the gas and liquid will preferably be mixed together prior to being flowed into the enclosure, and the mist will preferably be withdrawn near an upper surface of the enclosure, and the mist will preferably be withdrawn at a relatively high speed such that the mist droplets therein will not combine and reform into larger droplets. Corresponding apparatus is also disclosed for performing the discussed method.

According to the invention there is also provided a method of forming a thin film of a complex chemical compound on a substrate, comprising the steps of disposing a substrate in an enclosed deposition chamber, maintaining the deposition chamber under vacuum, generating a mist of a liquid containing a stoichiometrically-correct quantity of the complex chemical compound in a solvent, flowing the mist into the deposition chamber at a predetermined pressure and speed such that the mist flows over the surface of the substrate and a thin film of the mist is deposited thereon, and drying the thin film of the mist to remove the solvent therefrom.

Such method will preferably utilize mists formed using the turbine mist generating methods/apparatus as discussed above, while the mist will preferably be flowed into the deposition chamber at a pressure in the range of 500-700 torr, and at a rate of 300-10,000 cc/min. through $\frac{1}{4}''$ (0.635 cm) I.D. tubing. Additionally, the method will preferably include additional steps of maintaining an electric field about the substrate while the mist is being deposited thereon, curing the dried thin film using a UV energy source, and high temperature annealing the dried, cured thin film.

It is an object of the invention to provide methods-/apparatus which can be flexibly utilized to quickly deposit high quality thin films of many different complex chemical compounds under relatively wide ranges of operating conditions.

It is another object of the invention to provide such methods/apparatus which can be flexibly used to deposit high quality thin films of different chemical compounds quickly in succession.

It is yet another object of the invention to provide a method/apparatus for reliably and easily generating a fine, homogeneous mist of substantially any liquid or chemical solution under a wide range of operating conditions.

It is still another object of the invention to provide a method/apparatus for curing and annealing thin films of complex chemical compounds to improve the dielectric characteristics thereof.

Other objects, advantages and salient features of the present invention will become apparent from the following detailed description which, when taken into injunction with the next drawings, discloses preferred embodiments of the invention.

DETAILED DESCRIPTION OF PREFERRED EMBODIMENTS

Figure 1:
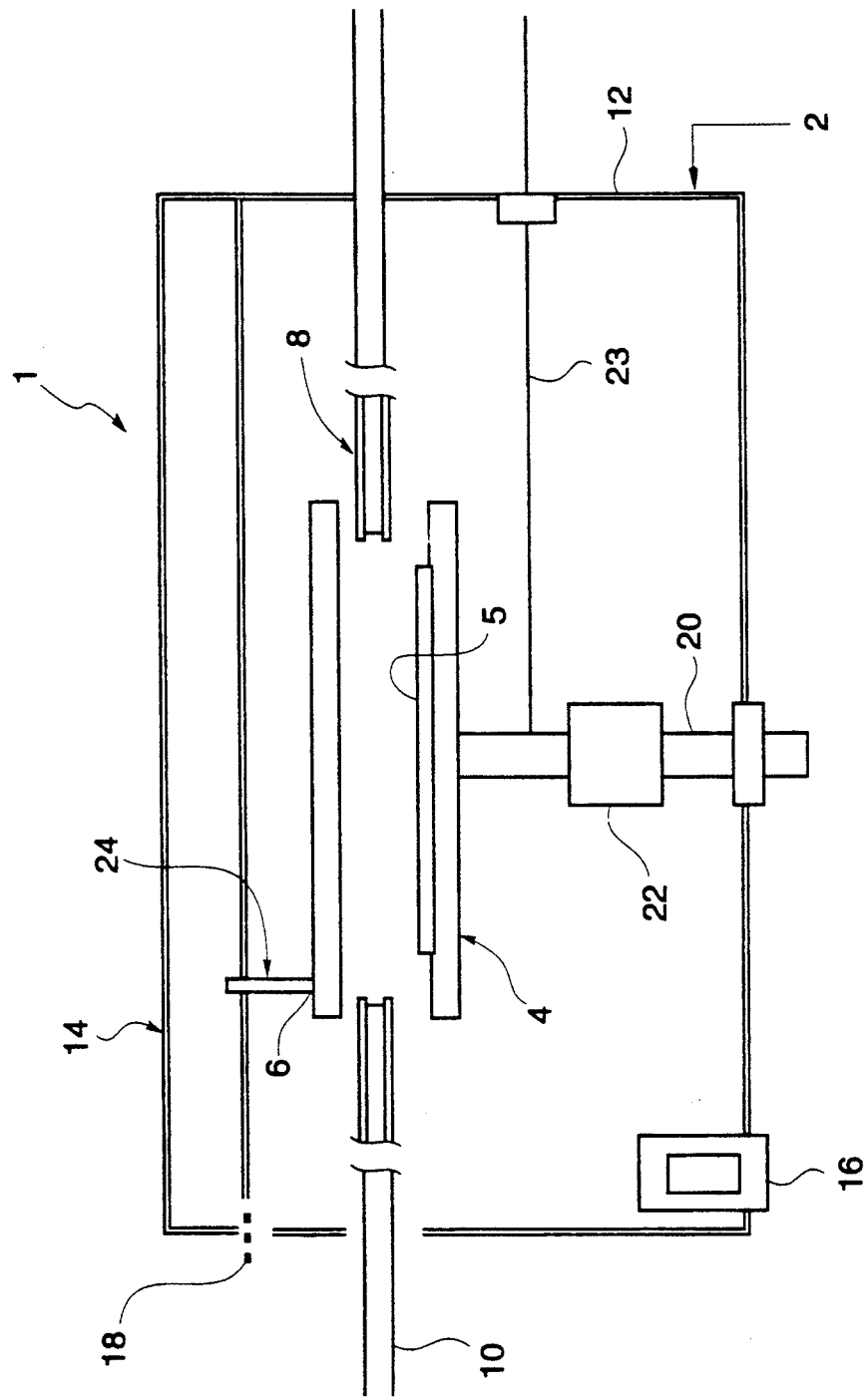
FIG. 1 is a schematic view of a LSCVD apparatus according to a previously proposed embodiment of the invention.

According to a primary aspect of the present invention, stabilized sources or stabilized solutions of desired chemical compounds will initially be prepared and then mists or vapors of the solutions will be generated, flowed into a deposition chamber and deposited in thin films/layers on substrates disposed within the deposition chamber. Such stabilized solutions specifically includes sol-gels (which include alcohols as the solvent base thereof), metallorganic decomposition (MOD) formulations (which utilize n-decanoic acid as the solvent base thereof), solutions having water as the solvent base thereof, solutions having carboxylic acid as the solvent base thereof, etc.

The term "stabilized source" as used herein is intended to designate a source which is obtained by mixing precursors for each element using sol-gel techniques, or other wet chemistry mixing techniques, which lead to a common solvent, and then using the solution having that common solvent as the sole source for the entire compound. Other sources may also be used in parallel for doping or modifying the compound. In the stabilized source the elements are already in the compound in solution with the common solvent or metallorganic precursor.

Use of the stabilized solutions is highly desirable for many reasons. First, the sources themselves are relatively easy to generate, even for complex compounds. In this regard, there is an extensive amount of published literature available detailing various sol-gel preparation techniques, MOD formulation techniques, etc. used in relation to the known liquid application methods of forming thin films, as discussed above. One such publication, Process Optimization and Characterization of Device Worthy Sol-gel Based PZT for Ferroelectric Memories is authored by two of the present inventors and others and appears in FERROELECTRICS, Vol. 109. The complete disclosure of the discussed publication is incorporated herein by reference thereto.

Further, the stabilized solutions used in the present invention are substantially less toxic and easier to handle than the corresponding reactants which are used in conventional, reactive CVD methods as discussed above, whereby the stabilized solutions can be handled and processed at substantially lower cost than the corresponding reactants.

Moreover, use of the stabilized compound sources assures high quality of the thin films produced thereby because the stabilized source can be accurately and consistently produced such that the desired chemical compound contained therein is uniformly, stoichiometrically correct, and because the deposition methods of the present invention do not involve any chemical reactions which might destabilize the chemical compound of its predetermined molecular formulation. Instead, thin films of the stabilized source are either directly deposited on substrates and subsequently dried under vacuum, or the desired chemical compound is efficiently dissociated from a solvent holding the compound in a mist/vapor of the stabilized source, thus permitting the chemical compound to deposit on the substrates.

Referring to FIG. 1, there is shown a thin film deposition apparatus according to a first embodiment of the invention, the apparatus being generally designated at 1. The apparatus 1 generally comprises a vacuum chamber 2, a substrate holder 4, a barrier plate 6, a nozzle assembly 8, and an exhaust assembly 10. The vacuum chamber 2 includes a main body 12, a lid 14 which is securable over the main body to define an enclosed space within the vacuum chamber, and the chamber is connected to an appropriate vacuum source (not shown) as generally indicated at 16. The lid 14 is preferably pivotally connected to the main body 12 using a hinge as indicated at 18.

The substrate holder 4 is preferably supported on a rotatable shaft 20 which is in turn connected to a motor (not shown) so that the holder may, if desired, be rotated during a deposition process. Indicated at 22 is an insulating connector which electrically insulates the substrate holder 4 and a substrate 5 supported thereon from the rest of the deposition apparatus 1 so that a DC or AC (RF) bias can be created between the substrate holder 4 and the barrier plate 6, if desired, utilizing the DC/RF feedthrough indicated at 23. Such a DC bias could be utilized, for example, for field-poling of thin films as they are being deposited on the substrate 5. For effecting such a DC bias an electrical source (not shown) would be operatively connected across the barrier 6 and the substrate holder 4.

The barrier plate 6 is preferably made of an electrically conductive material such as stainless steel, and is of sufficiently large size to extend completely over the substrate 5 in parallel thereto so that a vaporized source or mist as injected by the nozzle assembly 8 is forced to flow between the plate 6 and the substrate holder 4 over the substrate 5. As depicted, the barrier plate 6 is preferably connected to the lid 14 by a shaft 24 so that the plate 6 will be moved away from the substrate 5 whenever the lid is opened. The shaft 24 is preferably adjustable in length so that the spacing between the holder 4 and the plate 6 can be adjusted depending on the source materials, the flow rate, etc. For example, the spacing may be adjustable to define a spacing in the range of 0.10–2.00 inches.

Figure 2:
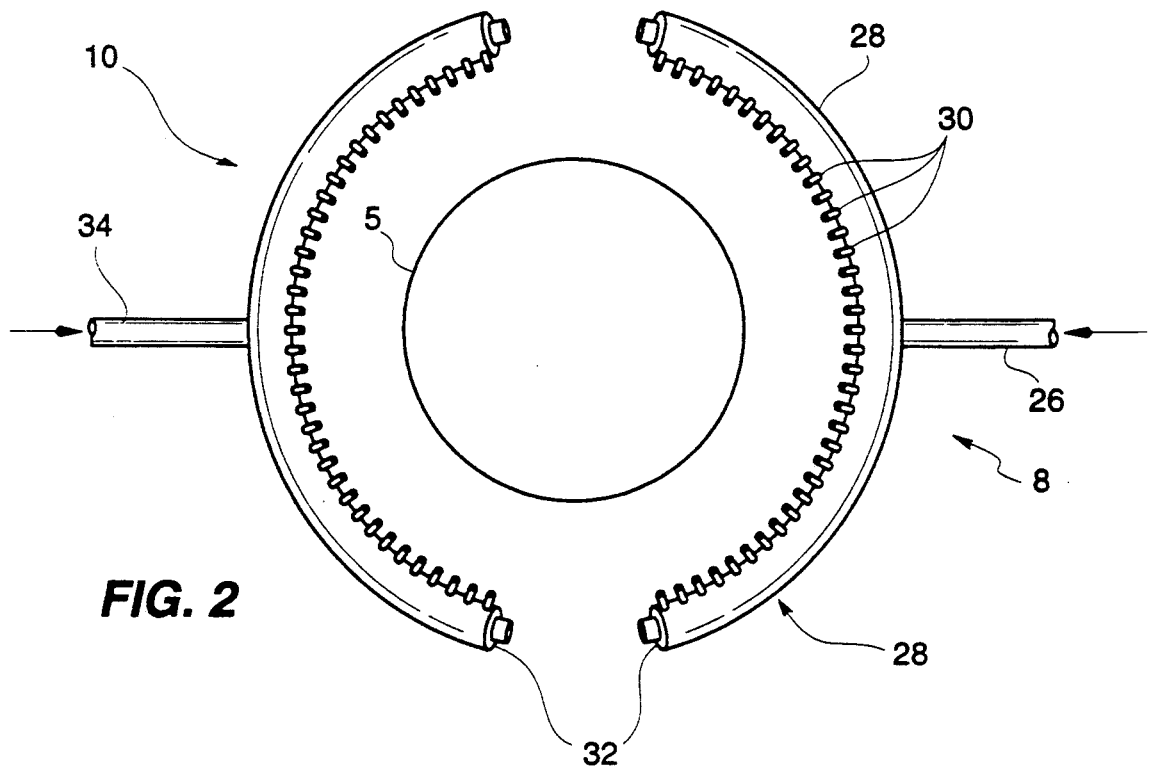
FIG. 2 is an enlarged plan view of a nozzle assembly and an exhaust assembly used in the embodiment of FIG. 1.

The nozzle assembly 8 and the exhaust assembly 10 are more particularly shown with reference to FIG. 2. As depicted, the nozzle assembly 8 preferably includes an input tube 26 which receives a vaporized source from a manifold assembly 40 as discussed below in relation to FIG. 3, and an arcuate nozzle tube 28 having a plurality of small holes with removable screws 30 provided in a uniformly spaced manner along a surface of the tube 28 facing inwardly of the deposition chamber 2. The screws 30 can be selectively removed depending on the stabilized source, flow rate, etc. to adjust the flow of the vaporized source over the substrate 5. Indicated at 32 are end caps of the tube 28. The structure of the exhaust assembly 10 is substantially the same as that of the nozzle assembly 8, except that a pipe 34 leads to a vacuum/exhaust source (not shown). As depicted, the arcuate tube 28 of the nozzle assembly 8 and the corresponding arcuate tube of the exhaust assembly 10 will preferably surround respective, oppositely disposed peripheral portions of the substrate 5, and the arcuate tubes will be spaced from each other across a central or intermediate portion of the substrate 5. Through such structure, and by adjusting the location of open holes in the two arcuate tubes, the flow of a vaporized source or mist over the substrate 5 can be well controlled for various sources, various flow rates, etc., for thereby achieving a uniform deposition of a thin film on the substrate 5.

Referring to FIGS. 1 and 2, the substrate holder 4, the barrier plate 6, the nozzle assembly 8 and the exhaust assembly 5 collectively cooperate to define a relatively small deposition cavity surrounding an upper-/exposed surface of the substrate 5, and within which the vaporized source is substantially contained throughout the deposition process.

Although preferred embodiments of the substrate holder, the barrier plate, the nozzle assembly and the exhaust assembly are shown and described, it will be understood that variations of such structures can be utilized within the scope of the present invention. For example, the arcuate nozzle and exhaust tubes could be replaced with tubes of other structures such as V-shaped or U-shaped, or could simply be replaced by a plurality of separate nozzles and separate exhaust ports.

Figure 3:
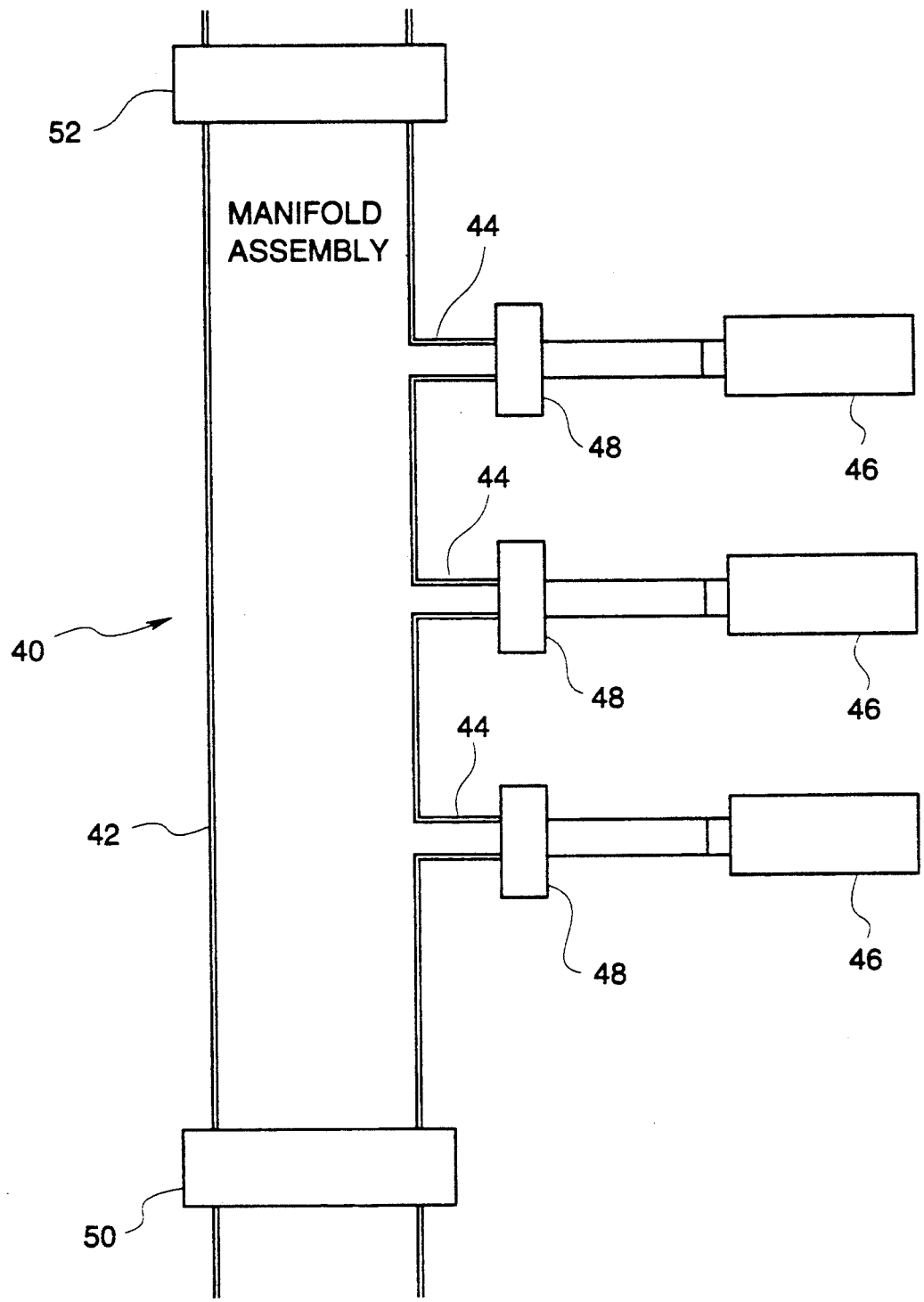
FIG. 3 is an enlarged schematic view of a manifold system used in previously proposed embodiments of the invention.

Referring to FIG. 3, there is shown a manifold assembly 40 according to the present invention. The manifold assembly 40 is utilized for supplying a vaporized source to the nozzle assembly 8, and generally comprises a mixing chamber 42, a plurality of inlets 44 which are connected to corresponding source generators 46 through respective valves 48, a valve 50 for regulating flow from the mixing chamber 42 to the nozzle assembly 8, and an exhaust valve 52. In use, one or more of the source generators 46 are utilized to generate one or more different vaporized sources or mists which are then flowed into the mixing chamber 42 through the valves 48 and inlets 44. The vaporized sources as flowed into the mixing chamber 42 are mixed to form a single, uniform vaporized source or mist, which is then flowed into the vacuum chamber 2 at an appropriate flow rate through the valve 50. The valve 50 can be selectively closed off so that the vacuum chamber 2 can be pumped down to dry a deposited film of a stabilized liquid source, or to clean and purge the system when necessary. Similarly, the outlet of the exhaust valve 52 is connected to a vacuum source (not shown) so that, when necessary to exhaust/purge one or more of the mist generators 46, the valve 50 can be closed off, the valve 52 and one or more of the valves 48 can be opened, and the mixing chamber 42 can be pumped down to clean and purge the source generator(s) and the mixing chamber.

It is preferred that a mist will be flowed from the manifold assembly 40 into the nozzle assembly 8 at ambient temperature or slightly above room temperature.

Figure 4:
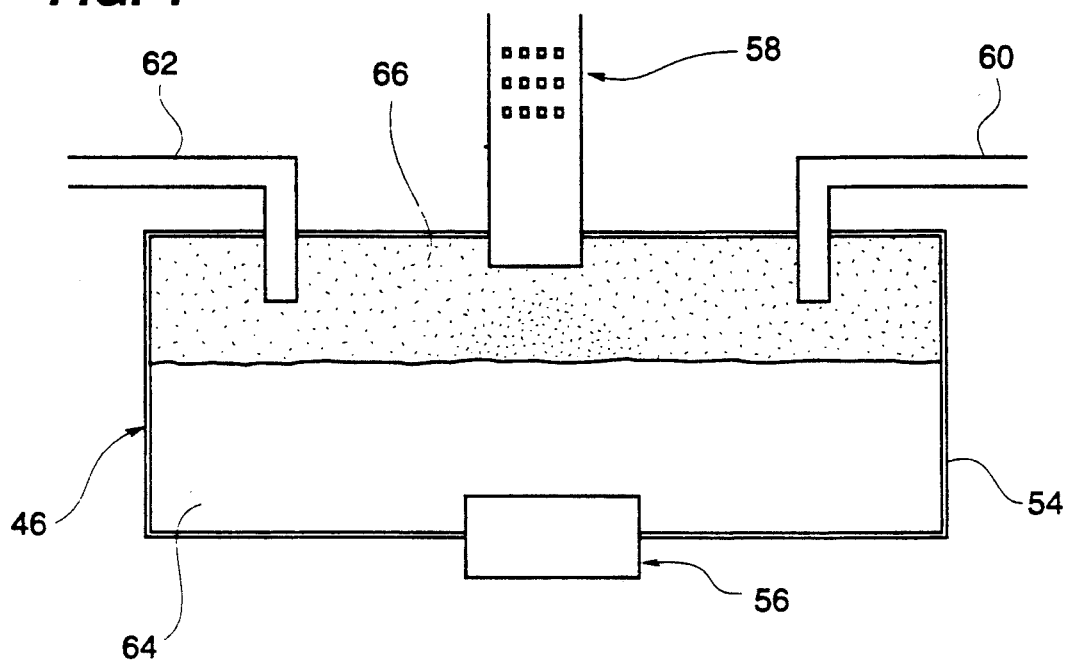
FIG. 4 is a vertical cross-sectional view of an apparatus for generating a liquid mist according to a previously disclosed embodiment of the invention.

Referring to FIG. 4, there is shown a preferred source generator 46 according to the invention. The generator 46 includes a closed container 54, an ultrasonic transducer 56 fluid-tightly sealed into the bottom of the container 54, a valve 58 for introducing a stabilized liquid source such as a sol-gel or an MOD formulation into the container 54 while the container is maintained under sealed, vacuum-tight conditions, and an inlet port 60 and an outlet port 62 for passing a carrier gas through the container 54. In use, a stabilized liquid source 64 will be introduced into the container 54 through the valve 58 up to an appropriate level as measured by a level-detecting means (not shown), the transducer 56 is activated to generate a mist 66 of the stabilized liquid source, and an appropriate carrier gas is passed through the mist 66 via the ports 60, 62 where it becomes wet or saturated with the mist, and the wet carrier gas is then passed from the outlet port 62 into the manifold assembly 40 as discussed above. The carrier gas will normally be an inert gas such as argon or helium, but may comprise a reactive gas in appropriate situations. The valve 58 will be selectively actuated as necessary to maintain the stabilized liquid source 64 at an appropriate level within the container 54.

The preferred source generator 46 as shown in FIG. 4 is particularly advantageous because it creates a vaporized source which can be effectively flowed or injected into the vacuum deposition chamber 2 without complications such as freezing.

An example of the sol-gel synthesis of $YMnO_3$ follows. 1 gm. of yttrium isopropoxide $Y[OCH(CH_3)_2]_3$ was mixed with 8 ml. of 2-methoxyethanol. The yttrium isopropoxide did not go into solution, but was forced into solution by the addition of approximately 25 drops (slightly over one ml.) of hydrochloric acid.

0.25 grams of manganese acetate $Mn(OOCCH_3)_2 \bullet H_2O$ was mixed with 5 ml. 2-methoxyethanol. The manganese acetate would not dissolve in the 2-methoxyethanol, but was forced into solution by the addition of approximately 10 drops of hydrochloric acid.

The yttrium and manganese solutions were then mixed together at room temperature resulting in a slightly yellow colored solution. The resulting $YMnO_3$ solution did not form a film when spun onto a silicon wafer. Adding $H_2O$ for hydrolysis did not improve the film-forming characteristics. However, the addition of approximately 25 drops of titanium isopropoxide (a gel former) to the yttrium/manganese solution resulted in a solution which remained clear for approximately 3 hours and formed good films when spun onto a silicon wafer.

Referring to FIG. 6, there is shown an exemplary flow chart depicting the preparation of a stabilized liquid solution of lead zirconium titanate (PZT hereinafter) to be deposited utilizing the apparatus of FIGS. 1-5. At steps $P_1$-$P_3$ stabilized liquid precursors of titanium isopropoxide, zirconium N-propoxide and lead acetate are respectively formed utilizing 2-methoxyethanol as the common solvent of each of the precursors. At step $P_4$ the stabilized solutions of titanium isopropoxide and zirconium n-propoxide are mixed, while at step $P_5$ such mixture is further mixed with the stabilized solution of lead acetate precursor together with dopants or additives (if any) desired in the thin film to be deposited. At step $P_6$ the final mixture of $P_5$ is filtered to form a stock solution as shown in $P_7$. Table I below represents a more detailed analysis of steps $P_1$-$P_7$.

TABLE I

| SOL-GEL PZT SOLUTION PROCESS FLOW SHEET | |
|---|---|
| 100 | STOICHIOMETRY |
| 110 | Pb: 94.7 gm $Pb(Ac)_2.3H_2O$ = 0.25 moles Pb. |
| 120 | Zr: 46.8 g Zr n-propoxide (30% propanol by weight) = 0.10 moles Zr. |
| 130 | Ti: 42.6 gm Ti-isopropoxide = 0.15 moles Ti. |
| 140 | 10:1 mole ratio (moles 2-methoxyethanol:moles metal). |
| 200 | LEAD PRECURSOR |
| 210 | 94.73 gm $Pb(Ac)_2.3H_2O$ is added to 197 ml 2-methoxyethanol. |
| 220 | Distill solution to a final vapor temperature of 114° C. |
| 230 | Amount of final distillate: 107 ml. |
| 300 | ZIRCONIUM PRECURSOR |
| 310 | 46.82 gm Zr n-propoxide in propanol is added to 79 ml 2-methoxyethanol. |
| 320 | Distill solution to a final vapor temperature of 113° C. |
| 330 | Amount of final distillate: 79 ml. |
| 400 | TITANIUM PRECURSOR |
| 410 | 42.62 gm Ti-isopropoxide is added to 118 ml 2-methoxyethanol. |
| 420 | Distill solution to a final vapor temperature of 114° C. |
| 430 | Amount of final distillate: 76 ml. |
| 500 | MIXING OF PRECURSORS |
| 510 | Add Ti precursor to Zr precursor and stir. |
| 520 | Add TiZr solution to Pb solution and stir for ½ hour(s). |
| 530 | Amount of PZT stock solution: 250 ml. |
| 540 | Filter PZT stock solution through an appropriate size syringe filter. |
| 550 | Molarity of solution: 1.0M (moles PZT/L of solution). |

At step $P_8$ the stock solution of $P_7$ is hydrolyzed using acetic acid and $H_2O$ or other appropriate materials, although such hydrolyzation step may be omitted as indicated by the dotted line extending from $P_7$ to $P_9$. The steps $P_1$ through $P_8$ are conventional steps utilized in forming sol-gels used in conventional spin-on thin film forming procedures.

At step $P_9$, the conventional stock solution of $P_7$ or the conventional hydrolyzed solution of $P_8$ are modified for use in the deposition process of the present invention.

Such step $P_9$ essentially involves adjusting the concentration of the desired chemical compound in the sol-gel, or other stabilized liquid source, such that small droplets of the vaporized source (mist) as flowed into the vacuum chamber 2 will deposit onto the substrate 5, spread out and interconnect to form a uniform film of the sol-gel over the entire upper surface of the substrate 5. In other words, the sol-gel concentration will be adjusted such that a film of the sol-gel will deposit completely over the substrate 5 before a significant amount of drying of the individual droplets occur, which would undesirably result in the creation of small disconnected particles on the substrate, the particles ultimately resulting in a thin film which is very porous and/or granular. Determination of the appropriate concentration of chemical compound in the sol-gel or other stabilized liquid source involves considerations of the particular chemical compound and solvent used in the stabilized liquid source, as well as of the vacuum level maintained within the vacuum chamber 2. For example, solvents having relatively high boiling points, such as 2-methoxyethanol used in the PZT sol-gel discussed above, are slower to dry than solvents having relatively low boiling points such as methanol; while higher vacuum levels result in faster drying of any given stabilized liquid source.

With the deposition of PZT from a sol-gel as prepared in the manner discussed above, and with the vacuum chamber 2 operating at a vacuum of 570-575 Torr, it is preferred that the stock solution of $P_7$ or the hydrolyzed solution of $P_8$ will be modified in step $P_9$ by the addition of 10-15 percent (by volume) of methanol. In other words, the normal sol-gel is diluted to a sufficient degree to assure that the small droplets of the vaporized source which deposit on the substrate 5 are sufficiently fluid to spread out and interconnect to form a continuous, uniform film as discussed above.

Although methanol is the preferred diluent for the sol-gel of PZT according to the present invention, it will be understood that other diluents (including 2-methoxyethanol) could be used for diluting the sol-gel of PZT, and that various other diluents would be utilized with other sol-gels and with other stabilized liquid sources used according to the present invention.

Figure 5:
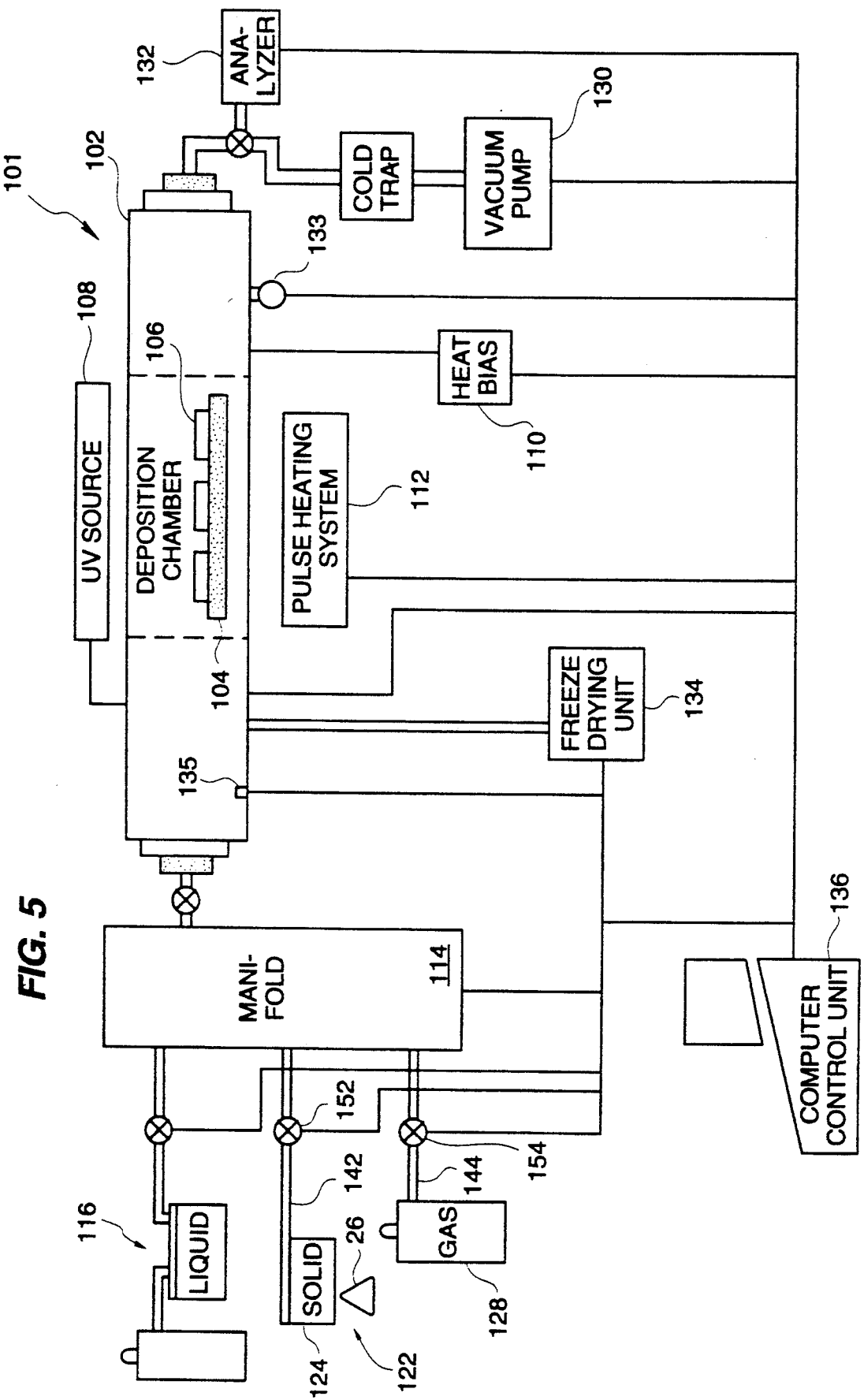
FIG. 5 is a schematic view of an LSCVD apparatus according to another previously proposed embodiment of the invention.

At step $P_{10}$ the modified solution of step $P_9$ is vaporized using a source generator such as shown in FIGS. 4 or 5, and is flowed into the deposition apparatus 1 through the manifold assembly 40 where it is deposited on the substrate 5 to form a thin film of the sol-gel. The thickness of the deposited thin film will be continuously monitored by conventional means (not shown).

At drying step $P_{11}$ the substrate 5 having a thin film of the sol-gel or other stabilized liquid source thereon is subjected to vacuum to remove the solvent from the sol-gel, thus leaving a thin film of the desired chemical compound on the substrate, while at step $P_{12}$ the thin film of the chemical compound will, if necessary, be annealed. In drying step $P_{11}$, drying of the sol-gel film may alternatively be accomplished by using a heating means to bake or otherwise heat the deposited film. Further, with many complex thin films, such as ferroelectrics, it is necessary to activate the dried thin film by annealing before the films will function in a desired manner. The drying and annealing steps $P_{11}$, $P_{12}$ may be effected within the vacuum chamber 2 using appropriate heating means, as discussed below in relation to further embodiments of the invention, or may be performed in different apparatus outside of the vacuum chamber 2.

At step $P_{13}$ the substrate having a thin film of the chemical compound thereon is further processed, such as by having a top electrode deposited thereon. The apparatus of the first embodiment of the present invention, as discussed above in relation to FIGS. 1-5 is very advantageous because it effectively combines the best of vacuum, CVD, and wet chemistry (sol-gel, MOD, etc.) techniques to readily produce very complex, multi-element films in a controlled environment. Some specific advantages includ the ability to carefully, consistently control the stoichiometry of thin films being deposited, the relative ease with which stabilized liquid sources may be generated and handled, the ability to keep the deposited films free from contaminants (because the deposition process is operated under vacuum conditions), the ability to form very thin, uniform films fully covering a substrate surface, etc.

As indicated by the structure of the deposition apparatus 1 shown in FIG. 1, i.e., the lack of any heating means therein, it is preferred that the deposition process according to the first embodiment of the invention will be conducted at room/ambient temperatures, especially when sol-gels are used as the stabilized liquid sources. As discussed below in relation to FIGS. 7-10 showing second and third embodiments of the invention, however, the deposition apparatus of the invention may also include one or more heating means to stimulate the deposition of chemical compounds from a stabilized, vaporized source onto a substrate according to the present invention. More particularly, it is preferred that one or more heating means will be utilized when forming thin films of materials such as free metals (i.e., containing no oxides); metal nitrides such as tantalum nitride, rare earth nitrides, etc.; sulfides; carbides; etc. Note that sol-gels generally produce only metallic oxides such as lead titanate, silicon dioxide, PZT, etc.

Referring to FIG. 5 there is shown a CVD apparatus 101 according to a second embodiment of the invention. Apparatus 101 includes a deposition chamber 102, a substrate holder 104 which has one or more substrates 106 supported thereon, a manifold assembly 114 for introducing a vaporized source(s) into chamber 102, first, second and third heating means 108, 110, 112 for applying heat to chamber 102, liquid, solid and gaseous source generators 116, 122 and 128 for introducing vaporized compound sources into the manifold assembly 114, a vacuum pump 130 cooperating with chamber 102, an analyzer 132 for analyzing the composition of gases exhausted from chamber 102, a cooling unit 134 for cooling chamber 102, pressure and temperature sensors 133, 135 and a computer control unit 136 to precisely control the apparatus 101.

Alternatively, the apparatus 101 could have substantially the same structure as that of apparatus 1 shown in FIG. 1 with the addition of the three heating means 108, 110, 112. In such an alternative apparatus, the substrate holder 4, the barrier plate 6, and the nozzle and exhaust assembles 8, 10 would have to be somewhat differently arranged (such as by being spread apart from each other) and/or structured to permit effective use of the heating means 108, 110, 112.

Source generators 116, 122 and 128 generate and feed a vaporized source or mist of at least one compound into manifold assembly 114, which in turn feeds the vaporized source into chamber 102. The generator 116 is the same as source generators 46, 46' discussed above in relation to FIGS. 1, 4 and 5. Also, the manifold assembly 114 is the same as the assembly 40 shown in FIG. 3.

Source generator 122 includes at least one container 124 for containing a solid source, and a heating means 126 which may be used to heat container 124 to vaporize the solid source, if necessary, and the vapors of the solid source are then fed into the manifold assembly 114 through tube 142 and valve 152.

Unit 128 is adapted to feed at least one gaseous compound into manifold assembly 114 through pipe 144 and valve 152.

Not all of units 116, 122, 128 will be used in every operation of apparatus 101, but rather one or more of units 116, 122, 128 will be used as necessary to deposit a given thin film. More than one of each of units 116, 122, 128 can be used to feed a vaporized source into manifold assembly 114 for any given thin film deposition.

Where heating of a vaporized compound source within chamber 102 is desired or necessary, for example for stimulating deposition or an increased deposition rate, the heating means 108, 110, 112 may be operated individually or in combination in a predetermined manner by control unit 136 to achieve a very high (precise) degree of control of the deposition of thin films. In general, means 108, 110, 112 are controlled such that the temperature within chamber 102 will gradually increase during the course of a deposition.

Heating means 108 includes one or more units spaced about chamber 102, and is preferably a light source for applying a spectral heating bath to chamber 102. The spectral heating bath heats the stabilized vaporized source within chamber 102 for dissociating a desired chemical compound therefrom to permit the compound to be deposited on substrate 106. According to another preferred aspect of the invention, the spectral heating bath applied by means 108 is tuned to optimize/maximize the dissociation of the desired chemical compound from the vaporized source. Heat waves/rays provided by means 108 will be generated and controlled in a predetermined manner to correspond to the energy needed to dissociate or crack the solvent bonds holding the desired compound in the corresponding stabilized source. Some preferred spectral sources which could be used in means 108 are ultraviolet (UV) lamps and excimer lasers.

If a ferroelectric thin film of $PbTiO_3$ is being deposited from a vaporized sol-gel source, for example, it is preferable to use a Danielson-type UV light source device controlled to emit UV light rays having a wavelength of approximately 180–260 nanometers. UV light rays in this wavelength range are particularly effective in resonating and dissociating the hydroxyl bonds holding the $PbTiO_3$ in the vaporized sol-gel source.

Means 108 can be controlled in either a pulsed manner or a constant manner. If an ultraviolet light source is used as means 108, it is preferable to operate the source in a pulsed manner to reduce the amount of ozone generated by the spectral bath within chamber 102 (bearing in mind that many of the complex thin films which may be deposited contain oxygen), and prevents the source from overheating.

Heating means 110 can be a conventional resistive heat bias type heater controlled by unit 136 to generate a high ambient temperature within chamber 102 and/or to heat substrates 106.

If means 110 is used in combination with means 108 and/or means 112, means 110 will preferably be operated to create an ambient temperature within chamber 102 which, when combined with the tuned spectral bath provided by means 108 and/or the timed heat pulses of the third heating means 112, will dissociate the desired component(s) from the vaporized source in an optimized, precisely controlled manner, without detrimentally affecting the deposited thin film or the underlying substrates 106. In such combined heating situations, means 110 is preferably operated to create an ambient temperature within chamber 102 which is not sufficient in and of itself to dissociate the desired compound from the vaporized compound source.

In controlling the heating means 108, 110, 112, two opposing considerations have to be weighed. On the one hand, higher quality of the deposited complex thin films can generally be achieved at lower ambient temperatures, but on the other hand higher production rates can be achieved at higher ambient temperatures. Although a generally high throughput, or production rate, is achieved according to the invention in comparison to conventional techniques, it is possible with some stabilized liquid sources to achieve even greater throughput by increasing the ambient temperature within chamber 102.

Means 112 includes one or more units spaced about chamber 102, and is controlled by unit 136 to apply heat energy heating pulses to the vaporized source within chamber 102 in a carefully timed/synchronized manner corresponding to a plurality of factors, including the particular stabilized source(s) being used, input flow rate of the vaporized source into chamber 102, desired thin film layer thickness, and (if necessary) the energy requirements needed to activate the thin film being deposited.

Means 112 is controlled by unit 136 to rapidly thermally stress chamber 102 with carefully timed high energy heating pulses during the course of a thin film deposition. When the means 112 is used to dynamically activate the thin film being deposited, the rapid thermal stressing of chamber 102 is preferably determined so that at every instant the film is at the right activation temperature for deposition, whereby the polar lattice of the film being deposited is being properly, dynamically activated. The rapid thermal stressing is calculated and controlled for continuing dissociation of the desired component(s) from the vaporized compound source to prevent the formation of large grains and secondary phases in the deposited film, and to maintain the temperature of the deposited film within acceptable limits of the particular substrate 106 onto which the film is being deposited, which may be an integrated circuit (IC). Acceptable limits of IC processing are a function of the particular IC step at which the film is being deposited. The temperature cannot be so high as to damage the underlying substrate or IC onto which the film is being deposited.

Means 112 preferably includes one or more halogen lamps, water cooled arc lamps and/or microwave sources placed about chamber 102 and aimed to direct high energy pulses towards a film being deposited. Means 112 is desirable in that it is controllable with a high degree of precision to quickly provide large amounts of energy when it is needed and where it is needed. By controlling means 112 it is possible to precisely control: the rate of chemical dissociations within chamber 102; the layer by layer thickness of the film being deposited and the activation of the film being deposited.

If the means 108 and 110 are used in combination and if means 108 is pulsed, such pulsing may (but not necessarily) correspond to the timed sequence of the high energy heating pulses applied by means 112.

If a ferroelectric thin film of $PbTiO_3$ is being deposited and if it is desired to heat the chamber 102 with both the heating means 108, 112, means 108 would be tuned to maximize dissociation of the hydroxyl bonds as discussed above, and means 112 would be actuated in short cycles, such as 3–10 seconds, to rapidly thermal stress chamber 102 to permit the $PbTiO_3$ to be deposited and activated on substrate 106 in a uniform, layer by layer manner.

An important parameter of many complex thin films, such as ferroelectrics, is that they are generally required to be quite thin (for example, within a range of 500 angstroms–5000 angstroms) and such film thicknesses can be readily achieved according to the invention. The invention can be used to generate much thicker films, if desired.

When the heating means are used according to the invention, the will preferably be controlled such that the temperature within chamber 102 progressively increases over the course of a film's deposition. Most preferably, such temperature increase will be precisely controlled in a stepped manner and unit 136 will be programmed with information pertaining to the desired/requisite temperature of the deposition process at each step thereof, $T_{si}t$ (si=time interval of the ith step), and the temperature rising rate $\pi$ within chamber 102.

Figure 6:
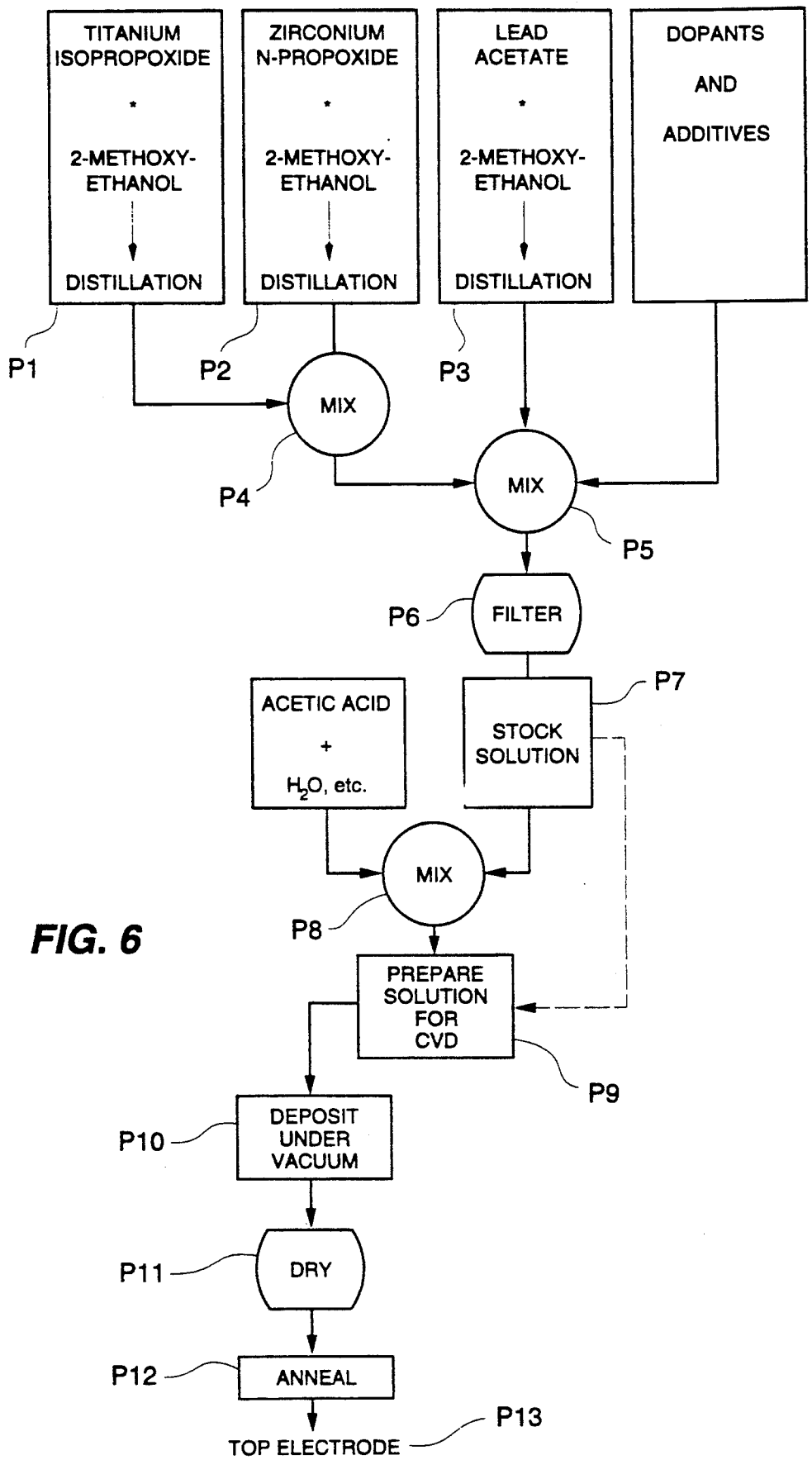
FIG. 6 is a flow chart for depositing thin films of chemical compounds using mists of solutions containing the compounds according to a previously proposed embodiment of the invention.

As an alternative to using the heating means 108, 110, 112 during a deposition process, the heating means may be used to bake and/or anneal a film of a stabilized liquid source which has previously been deposited on a substrate, the baking and annealing being conducted in situ within the deposition chamber 102, such as discussed above in relation to steps $P_{11}$ and $P_{12}$ of FIG. 6. Third heating means 112 is particularly effective for in-situ annealing of a deposited film within chamber 102. After the proper film thickness has been deposited and baked (if necessary), means 112 may be controlled to apply high temperature pulses to highly heat the film for an appropriate time period and at an appropriate temperature. Such appropriate time period can be as little as 3 seconds and should not exceed 2 minutes, while an appropriate temperature range is, for example, 700° C.–950° C. This rapid, in-situ, thermal annealing technique is advantageous because it eliminates the loss of certain critical elements (such as lead) which undesirably occurs during conventional, high temperature annealing processes.

A freeze drying unit 134 (or cold bed) may be used for lowering the temperature of chamber 102. Unit 134 is controlled by unit 136 according to predetermined parameters. Alternatively, a Misner coil chilled by $H_2O$ or a gas compressor could be used as unit 134.

The invention also includes a vacuum pump 130 because thin film depositions will preferably be carried out at pressures in the range of $10^{-2}$ Torr through $10^{-6}$ Torr.

Figure 7:
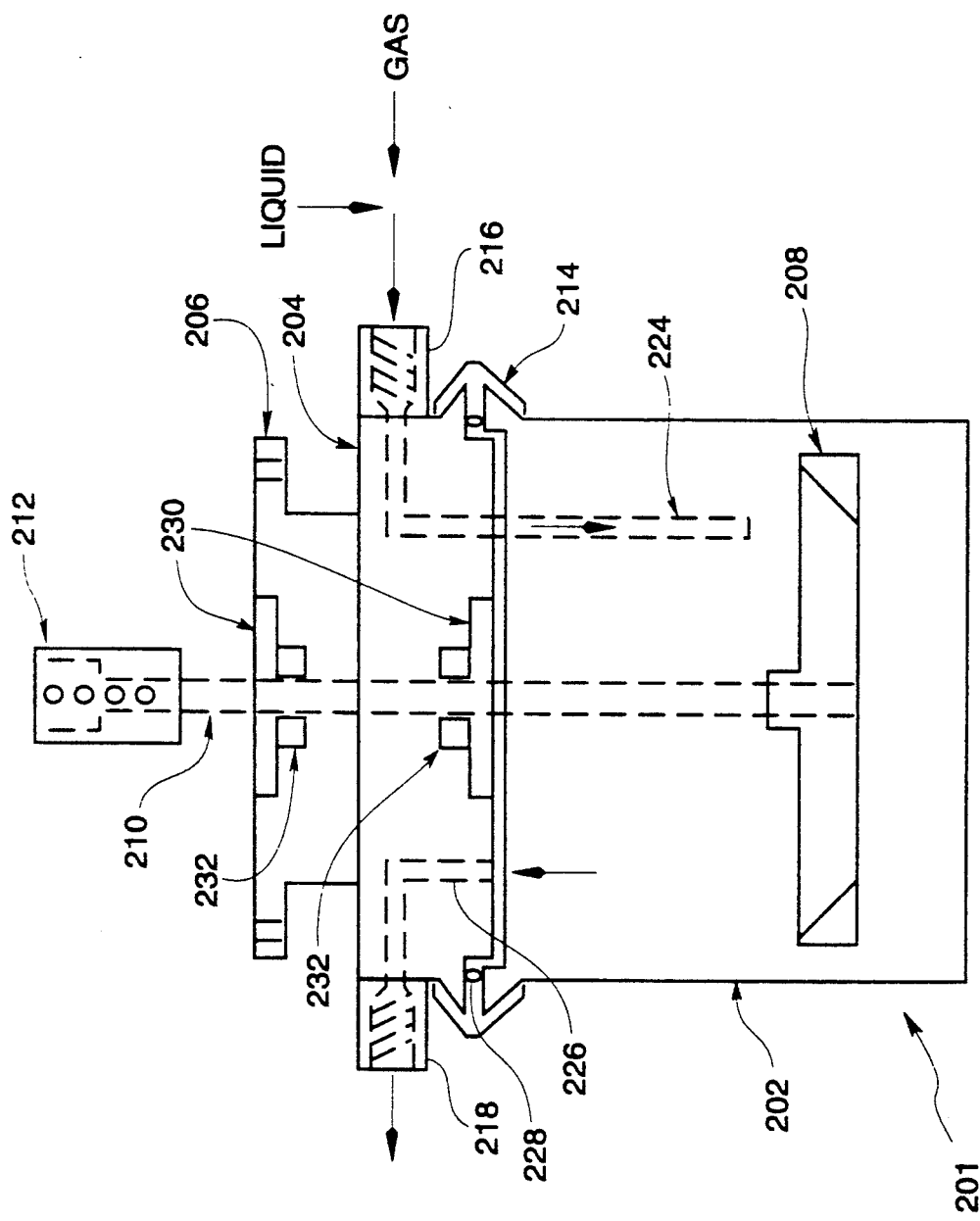
FIG. 7 is a front sectional view of a turbine mist generator according to a preferred embodiment of the invention.
Figure 8:
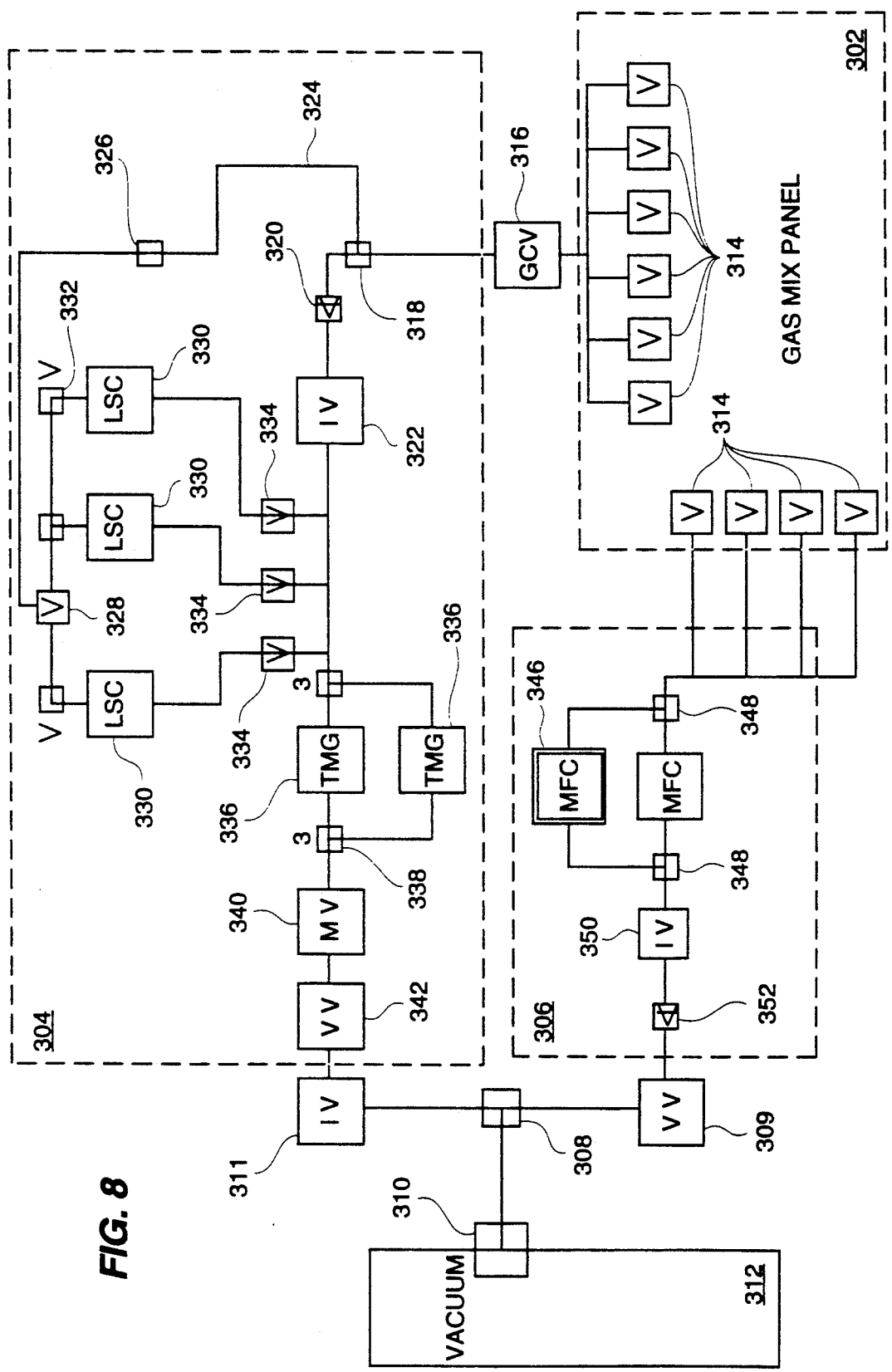
FIG. 8 is a schematic view of a gas and liquid delivery system according to an embodiment of the invention.

Referring to FIG. 7 there is shown a turbine mist generator according to the present invention. The generator is generally indicated at 201 and comprises a housing 202, a block assembly 204, 206 and a turbine blade assembly 208, 210, 212.

All components of the generator 201 which come into contact with the liquids or mists of chemical solutions will preferably be made of materials resistant to chemical corrosion, such as stainless steel.

The housing 202 and member 204 of the block assembly will preferably be joined together by appropriate means such as the depicted band clamp assembly 214, to define a vacuum-tight enclosure. An appropriate seal such as the O-ring 228 will preferably be provided between the housing and block member 204. The housing 202, turbine blade 208, blade shaft 210 and the lower surface of block member 204 (functioning as the lid for the housing 202) can be easily exposed for cleaning or servicing by releasing the band clamp 214 and separating the housing from the block assembly. The block assembly also includes bearings 230 and shaft seals for rotatably supporting the turbine blade shaft, while maintaining vacuum-tightness.

The block member 204 has an inlet 216 and an outlet 218 defined therein which have respective gas-tight couplings 220, 222 fixed thereto. The inlet 216 will preferably include a section of tubing 224 extending down into the housing 202 to a position just above the turbine blade 208. Through such an arrangement, a gas and liquid mixture (discussed further hereinbelow) flowing into the housing 202 through the inlet 216 will immediately impact on the rotating turbine blade 208. Applicant has found that such arrangement is particularly effective in forming fine, homogeneous mists of the gas and liquid. Somewhat similarly, the mist outlet 218 will have a shorter section of tubing 226 connected thereto which will extend to a lower surface of the member 204, which forms the upper end of the vacuum-tight enclosure. Applicant has found that the disposition of the turbine blade 208 and the gas/liquid inlet (as extended by the tubing 224) near a lower end of the housing 202 together with the disposition of the mist outlet near an upper end of the housing 202 is particularly effective for generating homogeneous, fine mists which are flowed out of the housing 202 through the outlet 218.

The turbine blade 208 is fixed to a lower end of a blade shaft 210 while the blade shaft 210 has a coupling 212 fixed to an upper end thereof, whereby the shaft can be quickly coupled to an appropriate motor (not shown) such as an electric or hydraulic motor for rotating the shaft and blade. Although only one blade 208 is depicted in FIG. 7, it will be understood that multiple blades could be used if desired. It is preferred that the motor will be capable of rotating the blade 208 at various speeds over a range of 100–10,000 rpm. Such range of speeds is desirable because it may be necessary to agitate various liquids more or less than other liquids to create a mist of same depending on various factors such as viscosity and the volume of mist being generated per unit time.

Significantly, however, applicant has found that the turbine mist generator according to the invention is (to a large extent) insensitive to parameters such as liquid temperature, liquid viscosity, volume of mist being generated per unit time, etc., whereby the turbine mist generator can reliably generate homogeneous, fine mists of many different liquids over a wide range of conditions without adjusting the operating parameters of the mist generator. Such insensitivity is, of course, very desirable because it permits the generator to easily and quickly output fine mists of various chemical solutions in relatively rapid sequence so that the mists can correspondingly be used rather rapidly for depositing thin films of the various chemical compounds according to other aspects of the invention. Such insensitivity should be contrasted with the relatively great sensitivity of the ultrasonic mist generators previously proposed by applicant, such as shown in FIG. 4.

Further, with applicant's previously proposed ultrasonic mist generators it was typically necessary to dilute most stable solutions of chemical compounds to generate fine mists of same suitable for use in applicant's LSCVD methods/apparatus. Typically, applicant found that it was necessary to dilute a stable chemical solution, such as a sol-gel, and MOD formulation, etc., by adding 10–50 volume % of additional solvent in order to achieve a mist which would deposit as a nice uniform film on a substrate. Such dilution is discussed in relation to step $P_9$ of FIG. 6 in parent application Ser. No. 660,428. Using a turbine mist generator according to the present invention, however, applicant has determined that the mist generated thereby is so homogeneous and fine that the dilution step can be eliminated or significantly reduced (such as by adding only 5–10 volume % of additional solvent) in relation to most chemical solutions. Thus, the turbine mist generator according to the invention greatly simplifies and expedites the formation of thin films of chemical compounds not only because the dilution step is eliminated or greatly simplified, but also because thicker layers of desired compounds can be more quickly deposited and dried using mists with higher concentrations of the desired compounds.

Although the turbine mist generator according to the invention can preferably be rotated at various speeds within the range of 100–10,000 rpm, as discussed above, it is particularly preferred that the turbine blade 208 will be rotated at a speed in the range of 750–1500 rpm for most chemical solutions because speeds above 1500 rpm may undesirably break down solutions of the complex chemical compounds. For example, applicant has found that a turbine speed of 1000 rpm works excellently for most ferroelectric compounds which applicant has formed thin films of, including those compounds discussed in the parent applications.

Liquid injection into the housing 202 is preferably accomplished by vacuum draw from an appropriate vacuum source connected to the mist outlet 218, which vacuum source also functions to withdraw generated mists from the vacuum enclosure. It is also preferred that the liquid will be mixed with a gas (carrier gas) prior to being drawn in through the inlet 216 such that the mixture thereof jointly flows into the housing 202 through the tubing 224. As generally indicated in FIG. 7, and more particularly shown in FIG. 9, the mixing of the gas and liquid is preferably accomplished by adding a controlled quantity of liquid to a regulated stream of the gas.

Referring to FIG. 8, there is presented a schematic diagram of a preferred gas/liquid delivery system for forming thin films of chemical compounds according to the invention. This system generally includes a gas mix panel 302, a mist generating section 304, and a gas injecting section 306. Also generally shown in FIG. 8 are a pre-mixed chamber 308, a vent valve 309, an injection nozzle 310, an injection valve 311, and a vacuum deposition chamber 312. The pre-mix chamber 308 together with the vent valve 309 and the injection valve 311 correspond to and may comprise applicant's previously proposed manifold assembly 40 shown in FIG. 3, the injection nozzle 310 corresponds to and may comprise applicant's previously proposed nozzle and exhaust assembly 8, 10 shown in FIGS. 1–2, and the vacuum deposition chamber 312 corresponds to and may comprise applicant's previously proposed deposition chamber 1 shown in FIG. 1.

The gas mix panel preferably comprises a plurality of gas sources respectively associated with valves 314, such as normally closed, pneumatically actuated valves which may be selectively opened as desired. A plurality of the valves 314 are connected to a gas control valve 316, which is preferably automatically controlled, and these valves 314, 316 provide a supply of carrier gas or gases regulated for flow and pressure to the liquid supply section 304. After the gas control valve 316 there is a three-way valve 318 which divides the gas flow into a primary flow path through a check valve 320 and an injection valve 322 and a secondary flow path including a purge line 324, a filter 326 such as a submicron filter, and another valve 328 leading to a plurality of liquid source containers 330. Each of the liquid source containers 330 will contain an appropriate stable solution such as a sol-gel, MOD formulation, etc. of a desired chemical compound, as more fully discussed in the parent applications, and each of the containers 330 has a valve 332 provided at the inlet thereof and another valve 334 provided at the outlet thereof. The valves 332 are preferably also normally closed, pneumatically actuated valves, while the valves 332 are preferably manual metering valves or closed loop, electronic metering valves.

As discussed above in relation to FIG. 7, liquids in the containers 330 are selectively flowed into a stream of carrier gas injected by the valve 322 so that the gas and liquid are mixed prior to being flowed into one or more turbine mist generators 336, having the same structure as the generator 201 shown in FIG. 7. Two of the turbine mist generators 336 are shown in FIG. 8 with three-way valves 338 provided at the inlets and outlets thereof. Although only two turbine mist generators 336 are shown, it will be understood that any number of such generators could be used in a system according to the invention, and that similarly more than three of the liquid source containers 330 could be used according to the invention.

After the mists are created in the turbine mist generators 336, they are flowed through a metering valve 340, a vent valve 342 and the injection valve 311 into the premix chamber 308. From the premix chamber 308 the mists may be directly injected into the vacuum deposition chamber 312 through the injection nozzle 310, or may initially be mixed with a gaseous component from the gas supply section 306.

The gas supply section 306 receives inputs from a plurality of the valves 314 of the gas mix panel 302, which inputs may include carrier gases, dopant gases, desired chemical compound vapors, etc. The gas supply section 306 includes a pair of mass flow controllers 346, a pair of three-way valves 348 disposed at the inlet and outlet of the controllers 346, an injection valve 350 and a check valve 352. Again, although only two of the mass flow controllers 346 are shown, any number of the controllers could be used according to the invention. The controllers 346 regulate gases for flow and pressure.

In operation, the deposition chamber 312 is connected to an appropriate vacuum source, such as indicated at in FIG. 1, so that the deposition chamber will be maintained at an appropriate vacuum level throughout a deposition process. The vacuum within the deposition chamber essentially drives the overall deposition process because such vacuum functions to draw the mists and/or vapors from the premix chamber 308 into the deposition chamber 312 at an appropriate pressure and speed, and the vacuum is also connected to the liquid and gas supply sections 304, 306 through the premix chamber 308 such that the vacuum draws mists from the section 304 and gases from the section 306 into the premix chamber 308. Thus, the vacuum within the deposition chamber 312 is the vacuum source which controls the rate at which mists are withdrawn from the turbine mist generators 336, as discussed above in relation to the generator 201 of FIG. 7. Additionally, exhaust assembly 10 in FIG. 1 is connected to a vacuum source, which could be the vacuum source 16, so that exhausted mists are continuously nitrogen purged and stable at appropriate pressures such as 1–7000 torr.

Although applicant's novel turbine mist generators can reliably generate fine mists of most liquids over a relatively wide ranges of conditions, as discussed above, applicant has found that the vacuum level within the deposition chamber 312 must be controlled within a relatively narrow range to achieve optimum deposition of thin films from mists according to the invention. Particularly, applicant has found that unless the mists are flowed from the turbine mist generators 336 into the deposition chamber 312 at relatively high speeds (these speeds being related to the vacuum level drawing the mists into the deposition chamber) fine liquid droplets in the mist tend to combine or reform into larger droplets, which yield inferior quality thin films. On the other hand, if the vacuum level is too high the mists may tend to freeze.

As an example, applicant has found that exceptional results are achieved when mists are being withdrawn from the turbine mist generators 336 at a rate of 200–10,000 cc/min., the tubing connecting the generators 336 to the deposition chamber 312 is ¼" (0.635 cm) I.D., and the deposition is maintained at a reduced pressure in the range of 500–700 torr and most preferably in the range of 550–610 torr. Under such conditions, applicant has obtained exceptional high quality results whether the stable liquid source is a sol-gel, MOD formulation, a carboxylate based solution, etc.

A process for depositing a thin film according to the present invention remains substantially the same as the process disclosed in parent application Ser. No. 660,428, a general example of which is shown in FIG. 6. The primary differences between the present method and the methods shown in FIG. 6 pertain to the use of applicant's novel turbine mist generators, which permit greater processing flexibility, and an added UV curing step between drying step $P_{11}$ and annealing step $P_{12}$ in FIG. 6. Particularly, and as discussed above, applicant has found that because the turbine mist generators work very efficiently under a wide range of conditions, step $P_9$ (preparing a stock chemical solution for LSCVD) is greatly simplified or eliminated in relation to most chemical solutions, while similarly deposition step $P_{10}$ is also greatly simplified because the fine homogeneous mists generated using the turbine mist generators are less sensitive to most processing parameters than are the mists formed using applicant's previously proposed ultrasonic mist generators.

Further, as also discussed above, applicant has discovered that the addition of a UV curing, or "cold-annealing", step prior to the high-temperature annealing at step $P_{12}$ greatly improves the dielectric characteristics of the resulting thin films. The UV curing functions to break excess solvent bonds remaining in the dried thin films from the organic solvent used in the chemical solution, thereby inducing additional, desirable crosslinking between molecules of the chemical compounds in the thin films. For example, if an alcohol was used as the solvent in the chemical solution hydroxyl groups (OH) will typically remain in the dried thin films. UV curing breaks the hydroxyl groups creating oxygen radicals which then bond with other atoms in the thin film, and thus ultimately enhancing the oxygen content of the thin films and creating a better and stronger crosslinked thin film with high dielectric characteristics.

Preferably, the UV energy source used in the curing step will be tuned to optimize breaking of desired bonds in the thin film. For example, if hydroxyl groups are to be broken, it is preferred that the UV energy source utilized will be a Danielson-type UV light source controlled to emit UV light rays having a wavelength of approximately 180–260 nanometers. UV light rays in this wavelength range are particularly effective in resonating and dissociating the hydroxyl bonds.

The temperatures achieved during the UV curing are preferably in a relatively low range of 100°–350° C., which is to be contrasted with the higher temperatures of 600°–850° C. utilized during the high-temperature annealing step $P_{12}$ in FIG. 6.

Additionally, applicant has found that particularly good results are achieved according to the invention when an electric field is maintained about a substrate during the mist deposition step $P_{10}$. As shown in FIG. 1, the electric field, a DC or AC (RF) bias, can be created in a confined space between a substrate holder 4 and a barrier plate 6 according to the invention utilizing an electrical feedthrough indicated at 23, while member 22 is an insulating connector which electrically insulates the substrate holder 4 and a substrate 5 supported thereon from the rest of the deposition apparatus. The electrical field is preferably in a relatively low voltage range of 0–400 V and is used for field poling which electrostatically enhances deposition of the mist droplets without breaking down the droplets. Such electric field according to the invention is to be distinguished from glow discharge (plasma) techniques conventionally used in CVD. In glow discharge a higher voltage, such as 500–1500 V, is used to break down a source to form a plasma which then deposits.

The electrical field may also be maintained during the drying and UV curing steps.

Although there have been described what are at present considered to be the preferred embodiments of the invention, it will be understood that the invention can be embodied in other specific forms without departing from the spirit or essential characteristics thereof. The present embodiments are, therefor, to be considered in all aspects as illustrative and not restrictive. The scope of the invention is indicated by the appended claims rather than by the foregoing description.

We claim:

1. Apparatus for forming a ferroelectric, super-conducting, or high dielectric constant thin film, said apparatus comprising:
   a source of a liquid, said liquid comprising one or more chemical elements;
   an enclosure;
   liquid introduction means for introducing liquid from said liquid source into said enclosure;
   rotating blade means in said enclosure for turning said liquid into a mist; and
   thin film forming means for utilizing said mist to form a ferroelectric, super-conducting, or high dielectric constant thin film comprising said one or more chemical elements, said thin film forming means including vacuum means for creating a vacuum to withdraw said mist from said enclosure and for drawing said liquid into said enclosure through said introduction means.

2. Apparatus as in claim 1 wherein said liquid introduction means comprises means for impacting said liquid onto said blade immediately after it enters said enclosure.

3. Apparatus as in claim 1 wherein said thin film forming means comprises a mist outlet located in an upper portion of said enclosure.

4. Apparatus as in claim 1 wherein said vacuum is between 500 torr and 700 torr.

5. Apparatus as in claim 1 wherein said liquid introduction means comprises a gas source and combining means for combining said liquid with gas from said gas source.

6. Apparatus as in claim 5 wherein said combining means comprises means for providing a regulated stream of gas from said gas source and means for adding a controlled quantity of said liquid to said gas stream.

7. Apparatus as in claim 1 wherein rotating blade means comprises a blade and a rotation means for rotating said blade, and wherein said blade rotates at between 750 rounds per minute and 1500 rounds per minute.

8. Apparatus as in claim 1 wherein said apparatus is capable of using a liquid solution selected from the group comprising sol-gel solutions and MOD type solutions as said liquid.

* * * * *